(12) United States Patent
Niset et al.

(10) Patent No.: US 7,292,473 B2
(45) Date of Patent: Nov. 6, 2007

(54) METHOD AND APPARATUS FOR PROGRAMMING/ERASING A NON-VOLATILE MEMORY

(75) Inventors: Martin L. Niset, Austin, TX (US); Andrew W. Hardell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 111 days.

(21) Appl. No.: 11/220,733

(22) Filed: Sep. 7, 2005

(65) Prior Publication Data

US 2007/0053222 A1 Mar. 8, 2007

(51) Int. Cl.
*G11C 11/34* (2006.01)

(52) U.S. Cl. .......................... 365/185.03; 365/185.11; 365/185.24

(58) Field of Classification Search ........... 365/185.03, 365/185.24, 185.11
See application file for complete search history.

(56) References Cited

U.S. PATENT DOCUMENTS

| | | | |
|---|---|---|---|
| 4,943,948 A | 7/1990 | Morton et al. | |
| 5,835,415 A | 11/1998 | Harari | |
| 5,963,480 A | 10/1999 | Harari | |
| 6,088,264 A * | 7/2000 | Hazen et al. | 365/185.11 |
| 6,462,988 B1 | 10/2002 | Harari | |
| 6,504,762 B1 | 1/2003 | Harari | |
| 6,570,790 B1 | 5/2003 | Harari | |
| 6,882,567 B1 * | 4/2005 | Wong | 365/185.03 |
| 7,120,063 B1 * | 10/2006 | Liu et al. | 365/185.24 |
| 2003/0218920 A1 | 11/2003 | Harari | |

* cited by examiner

*Primary Examiner*—Richard T. Elms
*Assistant Examiner*—N Nguyen
(74) *Attorney, Agent, or Firm*—Susan C. Hill; James L. Clingan, Jr.

(57) ABSTRACT

A non-volatile memory (NVM) that can be optimized for data retention or endurance is divided into portions that are optimized for one or the other or potentially some other storage characteristic. For the portion allotted for data retention, the memory cells are erased to a relatively greater extent. For the portion allotted for high endurance, the memory cells are erased to a relatively lesser extent. This is conveniently achieved by simply raising the level of the current reference that is used to determine if a cell has been sufficiently erased for the high data retention cells. The higher endurance cells thus will typically receive fewer erase pulses than the memory cells for high data retention. The reduced erasing requirement for the high endurance cells results in overall faster erasing and less stress on the high endurance cells as well as on the circuitry that generates the high erase voltages.

21 Claims, 3 Drawing Sheets

METHOD AND APPARATUS FOR PROGRAMMING/ERASING A NON-VOLATILE MEMORY

FIELD OF THE INVENTION

The present invention relates to non-volatile memory, and more particularly, to a method and apparatus for programming/erasing a nonvolatile memory.

RELATED ART

Non-volatile memory (NVM) which is capable of being programmed and erased multiple times is commonly used in a wide variety of applications. Generally, the NVM has a maximum number of program/erase cycles that can be performed while ensuring that a data retention specification is met.

BRIEF DESCRIPTION OF THE DRAWINGS

The present invention is illustrated by way of example and not limited by the accompanying figures, in which like references indicate similar elements, and in which.

Figure 1:
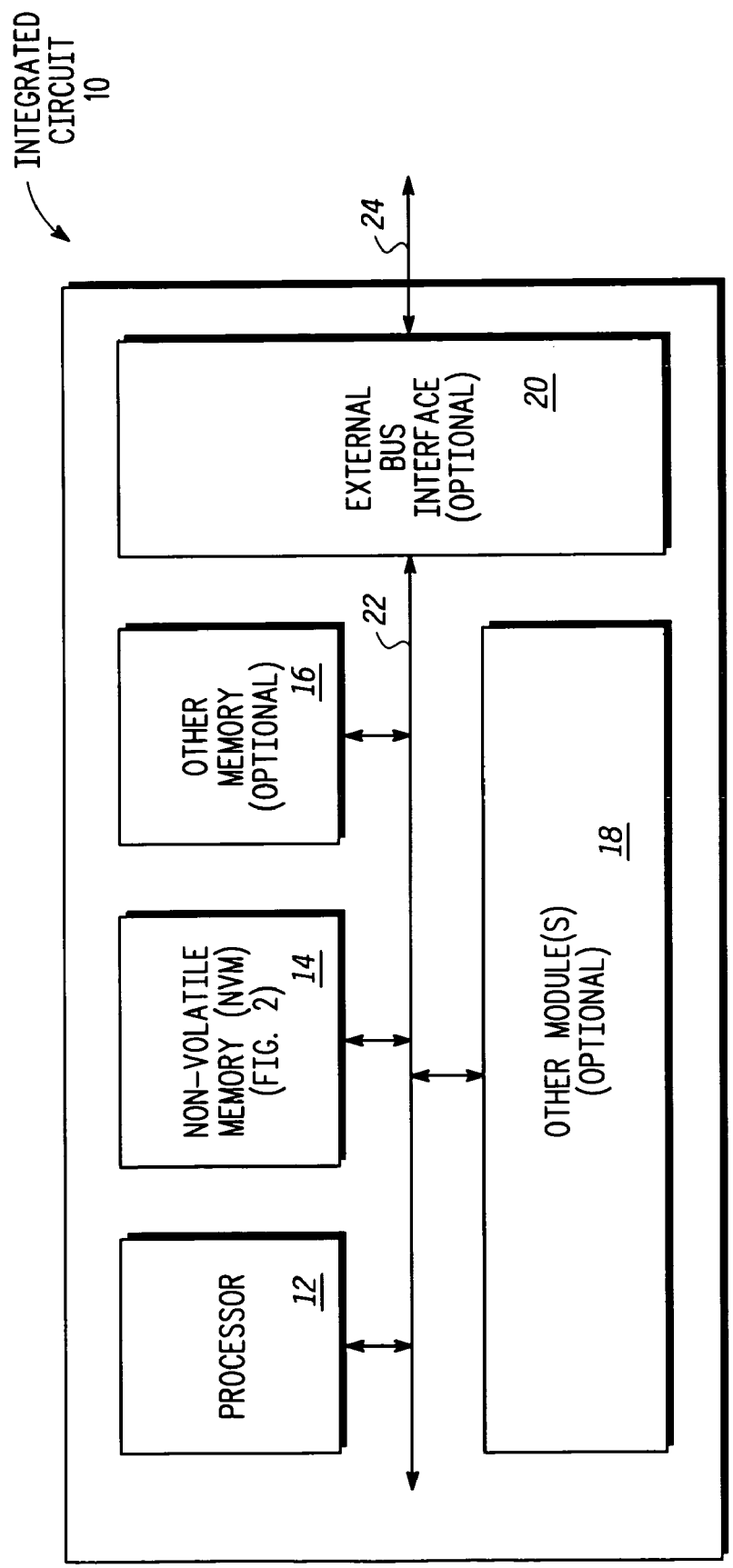
FIG. 1 illustrates, in block diagram form, an integrated circuit in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The data retention of an NVM cell is the amount of time that a predetermined data value will remain properly stored so that it is retrievable from the NVM cell. The endurance of the NVM cell is the maximum number of program/erase cycles that can be performed before the state of the NVM cell can no longer be reliably changed. Note that there are a variety of techniques that may be used to extend the viability of an NVM array when one or more NVM cells have failed either during testing or during usage (e.g. redundancy, error correction code, etc.).

NVMs may be programmed with any desired granularity. Although many NVMs are programmed on a per byte basis, alternate embodiments may be programmed on a bit, word, long word, sector, block, or any other desired basis. NVMs may be erased with any desired granularity. Although many NVMs are erased on a per sector basis, alternate embodiments may be erased on a bit, byte, word, long word, block, or any other desired basis.

A problem arises when a single NVM array 30 (see FIG. 2) must meet a maximum specification for data retention that is required by a first group of customers, while also meeting a maximum specification for endurance that is required by a second group of customers.

As one example, the first group of customers may be storing software code, e.g. instruction for processor 12 (see FIG. 1), which must remain stored for the lifetime of the product (e.g. twenty years). One example of such a product is an automobile which uses the NVM to store software code to perform engine control. This first group of customers may not require that the NVM perform many program/erase cycles. In this example, if the NVM stores software code, it is likely that the software code may never need to be erased and rewritten once it is initially stored in the NVM. Self-modifying software code is generally not used in most applications.

As a second example, the second group of customers may be storing data values, e.g. non-volatile but variable data, which needs to remain stored for a relatively shorter period of time (e.g. one month to five year). One example of such a product is an automobile which uses the NVM to store data values to represent engine tuning information. This second group of customers will require that the NVM perform many program/erase cycles (e.g. one program/erase cycle every time the automobile ignition is turned off and on). In this example, if the NVM stores data values, it is likely that the data values will be refreshed by a new program/erase cycle and thus do not need to have a long data retention time.

In addition, some customers will require both types of NVM in the same application. For example, the automotive customers described above will need some NVM having long data retention for software code, and will also need some NVM having high endurance for data values that are rewritten frequently. Also, customer requirements will vary as to how many portions and what size portions of the NVM will need to have long data retention. Similarly, customer requirements will vary as to how many portions and what size portions of the NVM will need to have high endurance.

FIG. 1 illustrates, in block diagram form, an integrated circuit (IC) 10 in accordance with one embodiment of the present invention. In the illustrated embodiment, IC 10 has a processor 12, an NVM 14, optional other memory 16, one or more optional other module(s) 18, and an optional external bus interface 20, each of which is bi-directionally coupled to bus 22. As used herein, the term bus is used to refer to a plurality of signals or conductors which may be used to transfer one or more various types of information, such as data, addresses, control, or status.

In some embodiments, IC 10 is a stand alone NVM and circuits 12, 16, and 18 are not implemented. In this case, the external bus interface 20 includes the address and data bus drivers for the NVM 14. In other embodiments, IC 10 is a microcontroller which has an NVM 14 as just one circuit available on the microcontroller. Any one or more of circuits 12, 14, 16, 18, and 20 may be coupled to one or more integrated circuit terminals (not shown) which may be used to communicate external to IC 10. In some embodiments, external bus 24 may be used to communicate to circuitry (not shown) that is external to integrated circuit 10. Other memory 16 may be any type of memory. Other modules 18 may include circuitry that is used for any desired purpose. Some examples of circuitry in other modules 18 includes timer circuitry, communication interface circuitry, display driver circuitry, analog to digital converters, digital to analog converters, power management circuitry, etc.

Figure 2:
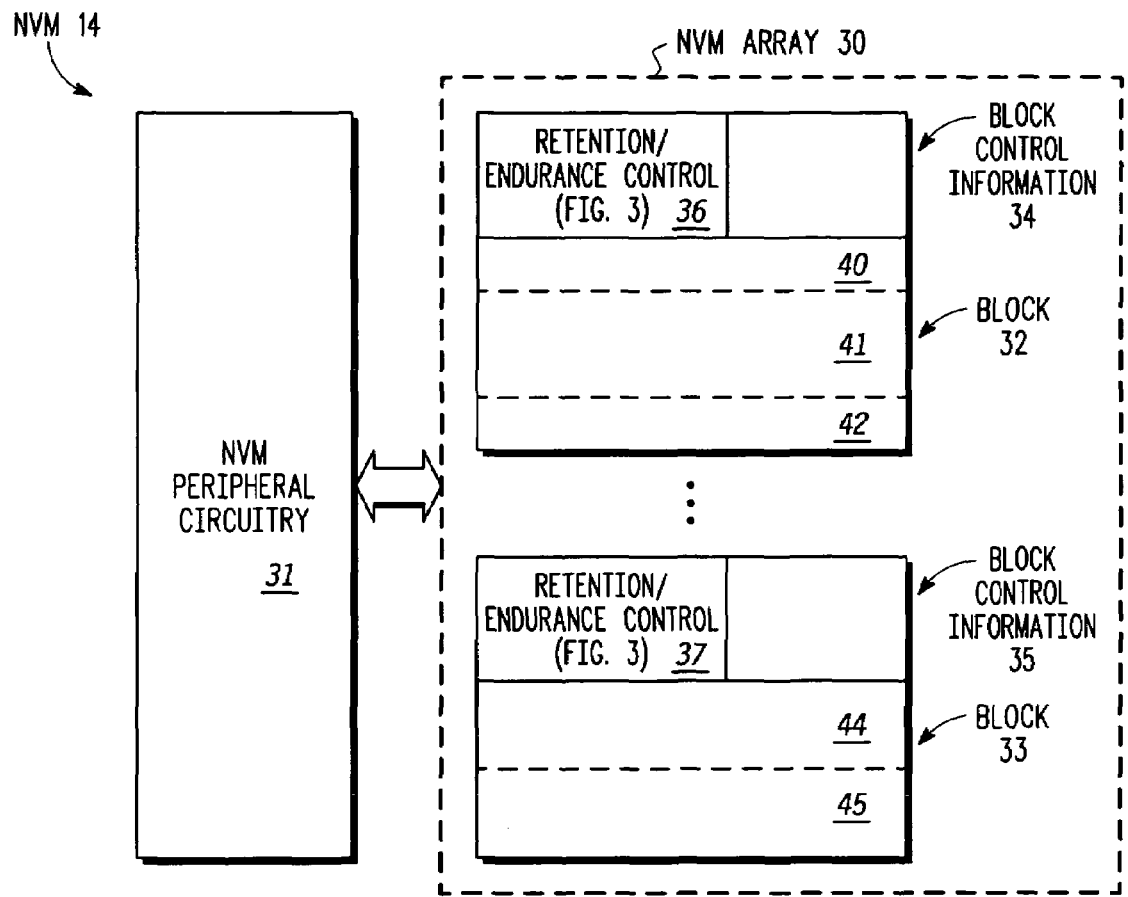
FIG. 2 illustrates, in block diagram form, an NVM 14 of FIG. 1 in accordance with one embodiment of the present invention.

FIG. 2 illustrates, in block diagram form, an NVM 14 of FIG. 1 in accordance with one embodiment of the present invention. In one embodiment, NVM 14 has an NVM array 30 bi-directionally coupled to NVM peripheral circuitry 31. NVM array 30 has a plurality of blocks, including block 32 and block 33. Block 32 has block control information 34 which stores information that is pertinent to block 32. Block 33 has block control information 35 which stores information that is pertinent to block 33. As one example, block control information 34 may include information which is used to control various characteristics of that particular NVM block 32 (e.g. length of erase pulse, maximum number of erase pulses, length of program pulse, maximum number of program pulses, etc.). Some embodiments may also store other additional information (e.g. the NVM manufacturing and/or testing history) in the block control information 34. These examples also apply to block 33 and block control information 35. Although FIG. 2 illustrates two blocks 32, 33 in detail, alternate embodiments may use any number of blocks, including just one block.

In the illustrated embodiment, block control information 34 includes retention/endurance control circuitry 36, and block control information 35 includes retention/endurance control circuitry 37. Alternate embodiments may locate retention/endurance control circuitry 36 and 37 anywhere within integrated circuit 10. There may be any number of retention/endurance control circuits (e.g. 36) for NVM array 30. The illustrated embodiment uses one retention/endurance control circuit (e.g. 36, 37) for each NVM block. However, alternate embodiments may use one retention/endurance control circuit for a different granularity (larger or smaller than a block) within the NVM array 30. For example, the entire NVM array 30 may have one retention/endurance control circuit used to select the storage characteristic.

Dashed lines are used to represent portions 40-42 of block 32. Similarly, dashed lines are used to represent portions 44-45 of block 33. Each portion 40, 41, 42, 44, 45 has a plurality of NVM cells. Retention/endurance control circuit 36 may be used to determine how many portions block 32 is partitioned into, and the size of each of the portions. Retention/endurance control circuit 37 may be used to determine how many portions block 33 is partitioned into, and the size of each of the portions. In one embodiment, retention/endurance control circuit 36 may also be used to determine or select a storage characteristic for each of the portions 40-42. Similarly, retention/endurance control circuit 37 may also be used to determine or select a storage characteristic for each of the portions 44-45.

As an example, retention/endurance control circuit 37 may select portion 44 to have the storage characteristic of high endurance, while selecting portion 45 to have the storage characteristic of long data retention. Alternately, retention/endurance control circuit 37 may select portion 45 to have the storage characteristic of high endurance, while selecting portion 44 to have the storage characteristic of long data retention. In a similar manner, as one example, retention/endurance control circuit 36 may select portions 40 and 42 to have the storage characteristic of high endurance, while selecting portion 41 to have the storage characteristic of long data retention. Retention/endurance control circuit 36 may alternately select any combination of storage characteristics for portions 40-42. Retention and endurance are two possible examples of storage characteristics. Alternate embodiments may use different or more storage characteristics (e.g. degree of hardness against radiation, data integrity for selected temperature range, etc.).

In the illustrated embodiment, NVM peripheral circuitry 31 includes all other circuitry necessary for the operation of NVM 14. In one embodiment, NVM peripheral circuitry 14 has a charge pump, high voltage regulator, high voltage switches, word line drivers, source line drivers, sense amplifiers, row decoders, column decoders, an interface to bus 22, registers, a read reference circuit, and any other circuitry that is desired for the functionality of NVM 14 (not shown). Note that for one embodiment, NVM peripheral circuitry 31 may operate in a conventional manner.

Figure 3:
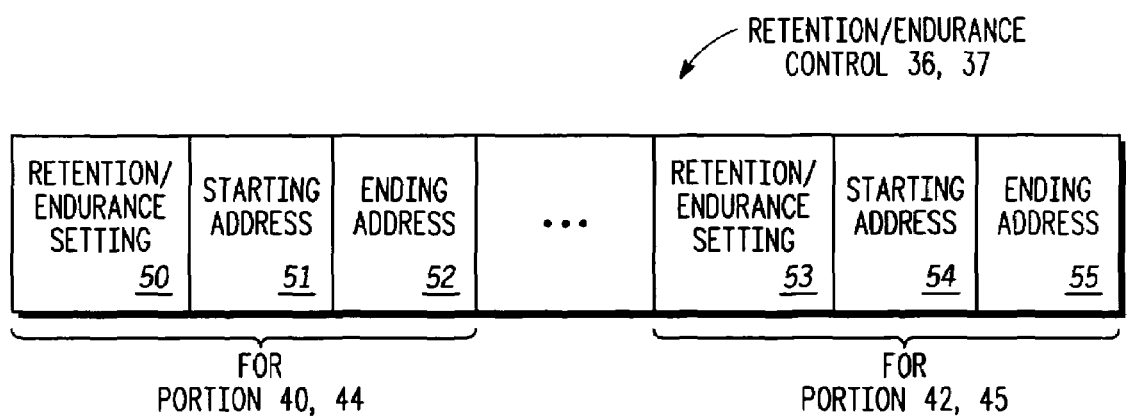
FIG. 3 illustrates, in block diagram form, a retention/endurance control circuit 36, 37 of FIG. 2 in accordance with one embodiment of the present invention.

FIG. 3 illustrates, in block diagram form, a retention/endurance control circuit 36, 37 of FIG. 2 in accordance with one embodiment of the present invention. In one embodiment, the retention/endurance setting 50 may be used to select the storage characteristic of the corresponding portion (portion 40 for retention/endurance control circuit 36, and portion 44 for retention/endurance control circuit 37). Similarly, the retention/endurance setting 53 may be used to select the storage characteristic of the corresponding portion (portion 42 for retention/endurance control circuit 36, and portion 45 for retention/endurance control circuit 37). In the embodiment illustrated in FIG. 3, there are two possible storage characteristics, namely long data retention and high endurance. Alternate embodiments may have three or more possible storage characteristics (e.g. long data retention, high endurance, and a combination which compromises between data retention and endurance). Alternate embodiments may use storage characteristic control circuit 50 to select between other storage characteristics. Endurance and data retention are just two possible examples of storage characteristics.

The starting address storage circuit 51 and the ending address storage circuit 52 are used to define the location and size of the corresponding NVM portion (portion 40 for control circuit 36, and portion 44 for control circuit 37). The starting address storage circuit 54 and the ending address storage circuit 55 are used to define the location and size of the corresponding NVM portion (portion 42 for control circuit 36, and portion 45 for control circuit 37). Alternate embodiments may define the location and size of the corresponding NVM portion in any desired manner. For example, a size storage circuit (not shown) may be used instead of an ending address storage circuit 52, 55. Alternately, the locations and sizes of the portion may be predetermined and the control storage circuits 51, 52, 54, 55 may not be needed. Alternately, other circuitry (e.g. protection circuitry in NVM peripheral circuitry 31) may be used to determine or partially affect the location and sizes of the portions 40, 41, 42, 44, 45.

Figure 4:
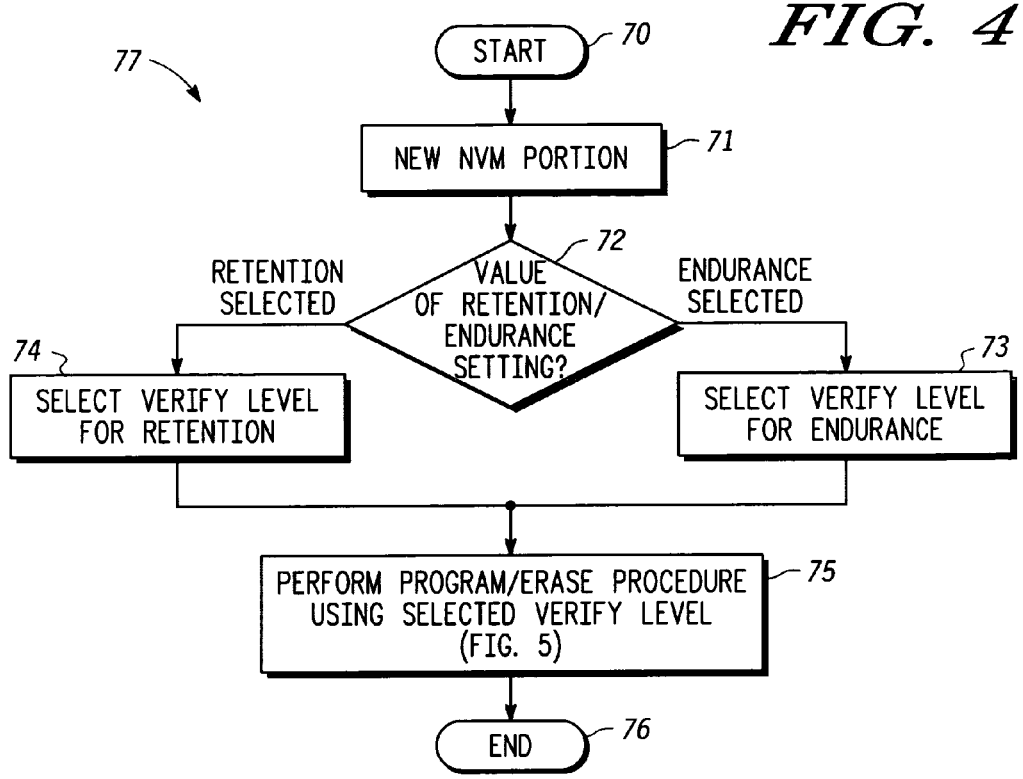
FIG. 4 illustrates, in flow diagram form, a method for programming/erasing an NVM in accordance with one embodiment of the present invention.

FIG. 4 illustrates, in flow diagram form, a method for programming/erasing an NVM in accordance with one embodiment of the present invention. The flow 77 starts at start oval 70 and proceeds to step 71 where a new NVM portion is selected or chosen. From step 71, the flow 77 continues to decision diamond 72 where the question is asked "what is the value of the retention/endurance setting 50, 53 for this portion?". If the value of the retention/endurance setting 50, 53 indicates that high endurance is selected, the flow continues to step 73 where the verify level for high endurance is selected. If the value of the retention/endurance setting 50, 53 indicates that long data retention is selected, the flow 77 continues to step 74 where the verify level for long data retention is selected. From both steps 73 and 74, the flow 77 continues to step 75 where the program/erase procedure is performed using the verify level selected in either step 73 or 74. From step 75, the flow 77 continues to oval 76 where the flow 77 ends.

Stimulus external to NVM array 30 may be used to initiate flow 77. One example of such an external stimulus may be processor 12 (see FIG. 1) initiating an erase or program within NVM 14. Note that the term program/erase has been used to indicate that the flow 77 may be used for both programming and erasing of NVM 14. Thus, the retention/endurance bits 50, 53 may be used in decision diamond 72 during either programming or erasing to determine whether high endurance or long data retention is selected.

Figure 5:
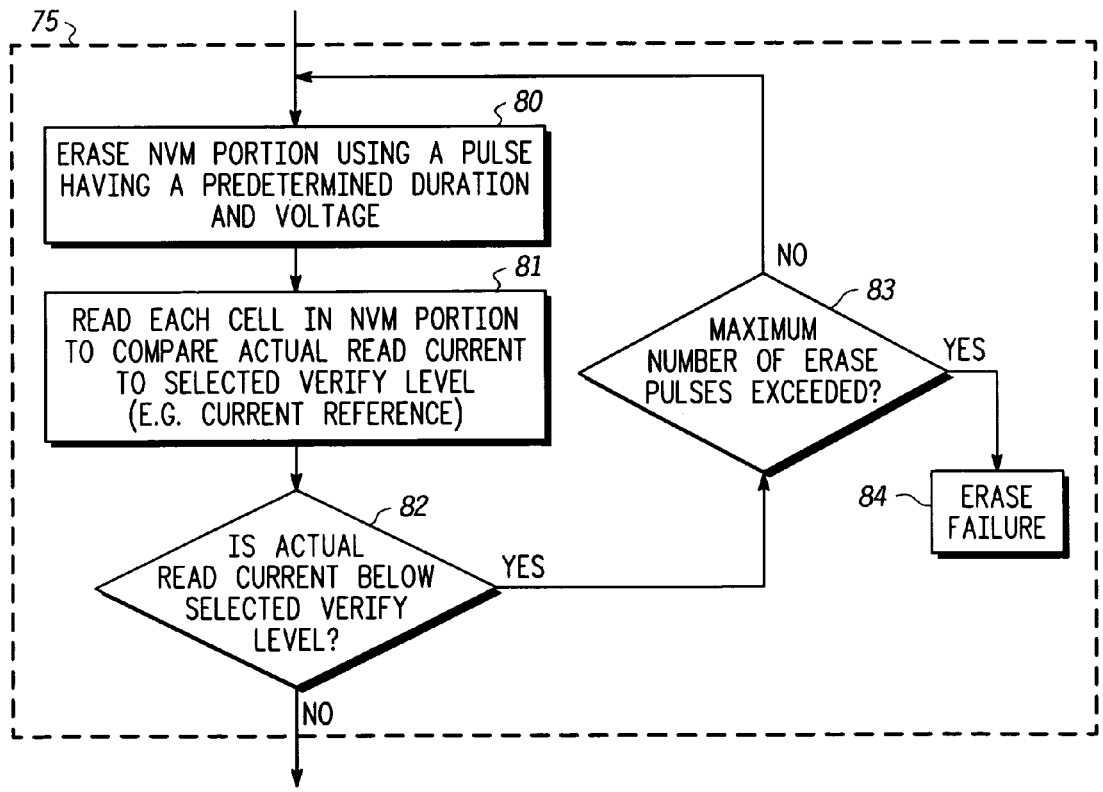
FIG. 5 illustrates, in flow diagram form, a method for performing an erase procedure 75 in an NVM in accordance with one embodiment of the present invention.

FIG. 5 illustrates, in flow diagram form, a method for performing an erase procedure in an NVM in accordance with one embodiment of the present invention. Note that FIG. 5 illustrates one possible embodiment of step 75 of FIG. 4. Alternate embodiments may use a different approach to perform step 75. Note that FIG. 5 applies only to erasing. In FIG. 5, the flow starts at step 80 where the relevant NVM portion is erased using a pulse which has a predetermined duration and voltage. From step 80, the flow continues to step 81 where each cell in the relevant NVM portion is read to compare the actual read current to the selected verify level (e.g. current reference). Note that the verify level was selected in flow 77 (see FIG. 4) in either step 73 or step 74. Referring to FIG. 5, from step 81 the flow continues to decision diamond 82 where the question is asked "is the actual read current below the selected verify level?". If the answer to decision diamond 82 is no, step 75 is complete. If the answer to decision diamond 82 is yes, the flow continues to decision diamond 83 where the question is asked "have a maximum number of erase pulses been exceeded?". If the answer to decision diamond 83 is yes, then the flow continues to step 84 where an erase failure is detected. If the answer to decision diamond 83 is no, then the flow returns to step 80. Note that a failure during erasing or programming may be due to circuitry in NVM array 30 and/or in NVM peripheral circuitry 31.

Referring to step 80 in FIG. 5, the pulse used for erasing (or alternately programming in a different embodiment) may have a selectable pulse duration and/or a selectable pulse voltage. The selection of pulse duration and/or pulse voltage may be achieved in a variety of ways. One such way is to use higher pulse voltage to maximize data retention, and to use lower pulse voltage to maximize endurance. Note that for the portions (e.g. 40, 44) of NVM array 30 allotted for data retention, the memory cells are erased to a relatively greater extent (e.g. more pulses and/or higher voltage pulses). For the portions (e.g. 41, 42, and 45) of NVM array 30 allotted for endurance, the memory cells are erased to a relatively lesser extent (e.g. fewer pulses and/or lower voltage pulses). Thus, this approach provides less stress on the NVM cells and NVM peripheral circuitry 31 allotted for endurance than on the NVM cells and NVM peripheral circuitry 31 allotted for data retention. Note that endurance is a function of stress. Reducing the stress increases the maximum endurance of the allotted portion.

Note that for one embodiment, the verify level is a reference current which is compared to the read current from the NVM cell. For one embodiment, the verify level for high endurance is a lower reference current, whereas for long data retention the verify level is a higher reference current. The absolute level of reference currents for both high endurance and long data retention will depend upon the specific circuits used to implement the NVM 14. However, for alternate embodiments, the verify level for high endurance may be a higher reference current, whereas for long data retention the verify level may be a lower reference current.

Alternate embodiments may use something other than a reference current to represent the verify level. For example, the verify level may be a reference voltage. Also, the reference may be compared to something other than read current. For example, the verify level may be a reference voltage that is compared to an NVM cell voltage (e.g. transistor threshold voltage). Alternate embodiments may use any desired circuit characteristic to represent the verify level.

In the illustrated embodiment, NVM peripheral circuitry 31 may store one or more verify levels. In one embodiment, the verify level is a reference current which is provided by a read reference circuit (not shown) in NVM peripheral circuitry 31. Which verify level is used is selected by the retention/endurance setting 50, 53 which corresponds to the NVM portion 40, 41, 42, 44, 45 which is being programmed or erased.

Note that the present invention is applicable to any type of NVM which can be programmed and erased a plurality of times.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for programming/erasing a non-volatile memory (NVM), comprising:
   defining a first portion of the NVM for having a first storage characteristic;
   defining a second portion of the NVM for having a second storage characteristic different from the first storage characteristic;
   performing a program/erase operation on the first portion that is more favorable for achieving the first storage characteristic than for achieving the second storage characteristic; and
   performing a program/erase operation on the second portion that is more favorable for achieving the second storage characteristic than for achieving the first storage characteristic,
   wherein the first storage characteristic is endurance and the second storage characteristic is retention.

2. The method of claim 1 further comprising:
   defining a third portion of the NVM for having a third storage characteristic; and
   performing a program/erase operation on the third portion that is more favorable for achieving the third storage characteristic than for achieving the first storage and more favorable for achieving the third storage characteristic than for achieving the second storage characteristic.

3. The method of claim 2, wherein:
the third storage characteristic is a combination of endurance and data retention.

4. The method of claim 1 wherein:
the NVM comprises a memory array;
the first portion comprises a first plurality of memory cells of the memory array;
the second portion comprises a second plurality of memory cells of the memory array;
the program/erase operation on the first portion comprises an erase operation in which each memory cell of the first plurality of memory cells has a current compared to a reference current of a first level; and
the program/erase operation on the second portion comprises an erase operation in which each memory cell of the second plurality of memory cells has a current compared to a reference current of a second level in which the second level is different from the first level.

5. The method of claim 4 wherein:
the program/erase operation is an erase operation; and
the first level is lower than the second level.

6. The method of claim 1 wherein:
the program/erase operation on the first portion provides a first program/erase margin; and
the program/erase operation on the second portion provides a second program/erase margin, wherein the second margin is greater than the first margin.

7. The method of claim 6 wherein the program/erase operation on the second portion provides a greater stress on the second portion than the program/erase operation on the first portion provides on the first portion.

8. The method of claim 7 wherein the greater stress arises from applying more program/erase pulses.

9. The method of claim 7 wherein the greater stress arises from applying program/erase pulses at a higher voltage.

10. The method of claim 6 wherein the program/erase operations on the first and second portions are performed by a peripheral circuit that experiences less stress in performing the program/erase operation on the first portion than in performing the program/erase operation on the second portion.

11. A non-volatile memory (NVM), comprising:
an NVM array;
a control circuit means for defining a first portion of the NVM array to have a first storage characteristic and a second portion of the NVM array to have a second storage characteristic different from the first characteristic; and
program/erase means for performing a program/erase operation on the first portion that is more favorable for achieving the first storage characteristic than for achieving the second storage characteristic and a program/erase operation on the second portion that is more favorable for achieving the second storage characteristic than for achieving the first storage characteristic, wherein the first storage characteristic is endurance and the second storage characteristic is retention.

12. The NVM of claim 11, wherein:
the program/erase operation on the first portion provides less stress than the program/erase operation on the second portion.

13. The NVM of claim 12 wherein the greater stress arises from applying more program/erase pulses.

14. The NVM of claim 12 wherein the greater stress arises from applying program/erase pulses at a higher voltage.

15. The NVM of claim 12 wherein the performing the program/erase operations on the first and second portions are performed by a peripheral circuit that experiences less stress in performing the program/erase operation on the first portion than in performing the program/erase operation on the second portion.

16. The NVM of claim 12, wherein:
the first portion comprises a first plurality of memory cells of the NVM array;
the second portion comprises a second plurality of memory cells of the NVM array;
the program/erase operation on the first portion comprises an erase operation in which each memory cell of the first plurality of memory cells has a current compared to a reference current of a first level; and
the program/erase operation on the second portion comprises an erase operation in which each memory cell of the second plurality of memory cells has a current compared to a reference current of a second level in which the second level is different from the first level.

17. The NVM of claim 11, wherein:
the program/erase operation on the first portion provides a first program/erase margin; and
the program/erase operation on the second portion provides a second program erase margin, wherein the second margin is greater than the first margin.

18. A method of programming/erasing a non-volatile memory (NVM) cell, comprising:
determining a desired storage characteristic of the NVM cell,
wherein the step of determining the desired storage characteristic comprises selecting at least one of retention or endurance;
selecting a program/erase methodology, from a plurality of program/erase methodologies, for the desired storage characteristic; and
performing the selected program/erase methodology.

19. The method of claim 18, wherein the step of selecting at least one of retention or endurance comprises selecting both retention and endurance.

20. The method of claim 19, wherein:
the plurality of program/erase methodologies comprises a program/erase methodology for retention and a program/erase methodology for endurance; and
the program/erase methodology for retention generates more stress than the program/erase methodology for endurance.

21. A method for programming/erasing a non-volatile memory (NVM), comprising:
defining a first portion of the NVM for having a first storage characteristic;
defining a second portion of the NVM for having a second storage characteristic different from the first storage characteristic;
performing a program/erase operation on the first portion that is more favorable for achieving the first storage characteristic than for achieving the second storage characteristic; and
performing a program/erase operation on the second portion that is more favorable for achieving the second storage characteristic than for achieving the first storage characteristic,
wherein the first storage characteristic comprises at least endurance and the second storage characteristic comprises at least retention.

* * * * *